United States Patent [19]

Frankosky

[11] Patent Number: 5,604,017
[45] Date of Patent: Feb. 18, 1997

[54] MULTI-DIELECTRIC LAMINATES

[75] Inventor: John C. Frankosky, Wilmington, Del.

[73] Assignee: Arlon, Inc., Maitland, Fla.

[21] Appl. No.: 328,234

[22] Filed: Oct. 24, 1994

Related U.S. Application Data

[63] Continuation of Ser. No. 508,803, Apr. 11, 1990, abandoned.
[51] Int. Cl.$^6$ ........................................................ B32B 9/00
[52] U.S. Cl. ............................ 428/209; 428/86; 428/87; 428/96; 428/114; 428/119; 428/421; 174/255; 174/256
[58] Field of Search ............................ 428/86, 87, 96, 428/114, 119, 209, 421; 174/255, 256

[56] References Cited

U.S. PATENT DOCUMENTS

| | | | |
|---|---|---|---|
| 4,759,965 | 7/1988 | Kato et al. | 428/209 |
| 5,098,769 | 3/1992 | Nakai et al. | 428/209 |
| 5,194,326 | 3/1993 | Arthur et al. | 428/209 |
| 5,316,831 | 5/1994 | Nakajima et al. | 428/209 |

*Primary Examiner*—Patrick Ryan
*Assistant Examiner*—Cathy K. Lam
*Attorney, Agent, or Firm*—Maguire, Voorhis & Wells, P.A.

[57] ABSTRACT

The present invention relates to dielectric materials used in circuit board, radar and microwave applications and methods of making these materials. The dielectric materials of this invention are characterized by having a ground plane, at least two dielectric materials having different dielectric constants and a common conducting layer positioned over the dielectric materials.

30 Claims, 1 Drawing Sheet

MULTI-DIELECTRIC LAMINATES

This application is a continuation of application No. 07/508,803, filed Apr. 11, 1990, now abandoned.

FIELD OF THE INVENTION

The present invention relates generally to dielectric materials used in circuit boards and radar and microwave applications and more specifically to materials having different dielectric constants on one continuous substrate and overlain by a common conductor.

BACKGROUND OF THE INVENTION

A dielectric is an insulating material that does not conduct electrons easily and thus has the ability to store electrical energy when a potential difference exists across it. The stored energy is known as an electric potential or an electrostatic field which holds electrons. When the buildup of electrons becomes sufficiently large, the electric potential is discharged. Some common dielectric materials include glass, mica, mineral oil, paper, paraffin, polystyrene and porcelain. The effectiveness of a dielectric material is determined by its molecular constituents and its thickness.

In electronic circuits, dielectric materials are employed in capacitors and as circuit board substrates. High dielectric constant materials are used in radar or microwave applications and also for circuit miniaturization as the speed of propagation of signal at a constant frequency is proportional to the inverse of the square root of the dielectric constant of the medium through which it passes. Low dielectric constant materials are used for high speed, low loss transmission of signals as such materials allow faster signal propagation. Low dielectric materials also have radar and microwave applications. If the combination of materials is such that the loss tangent for a material of a given frequency signal is very low, the circuit board will allow very efficient transmission or splitting of the signal without electrical loss related to the hysteresis loop—(i.e. the graphical representation of by material field as a response to imposed alternating fields.) If a whole circuit were built on low dielectric material, one could amplify the signal only a certain amount at each mounted transistor because of the power involved which would build up excessive heat and temperature. Consequently, the amplification was spread over a large space. If all of the dielectric material had a high dielectric constant, there would be more loss at signal splits so that more transistors would be necessary to maintain a specific signal to noise ratio.

Because most applications require materials having a particular dielectric constant, there has been no need to juxtapose different types of dielectric material onto a common ground plane and overlain by a common conductor. Applicants have recognized that it would be particularly advantageous to have on one ground plane, materials of different dielectric constants, overlain by a common conductor, particularly if the different materials are to be used in conjunction with one another to take advantage of their differing properties.

It is accordingly an object of the present invention to create a MULTI-DIELECTRIC LAMINATE in which materials of different dielectric constants may be placed onto one common ground plane.

It is a further objective of the invention to obviate the necessity for a constant impedance device (a device which impedes current flow within an RLC circuit) and to eliminate the need for fastening separate ground planes, conductors and impedance devices onto a multi-dielectric laminate.

Another object of the invention is to shorten the time and expense required for printing, etching or wet processing onto separate conductor pieces of a multi-dielectric laminate.

Yet another object of the device is to increase the structural integrity and reliability of a multi-dielectric laminate.

Still another object of the invention is to create a multi-dielectric laminate on which the circuit lines may be printed and etched onto a common conductor across several types of dielectric materials to take advantage of their different properties.

SUMMARY OF THE INVENTION

To achieve these and other aspects of the invention, applicant has created a multi-dielectric laminate comprising a common conductor overlying materials having different dielectric constants laminated onto one continuous ground plane. By employing a continuous conductor and ground plane, the need for constant impedance devices or conductor jumpers are eliminated and the top surface of the conductors may be printed and etched as a continuous piece, rather than upon individual conductor segments, with allowances for the constant impedance lines across each dielectric.

The invention will be better understood in conjunction with the Detailed Description of the Preferred Embodiment and the appended drawings, of which:

DETAILED DESCRIPTION OF THE PREFERRED EMBODIMENT

Figure 1:
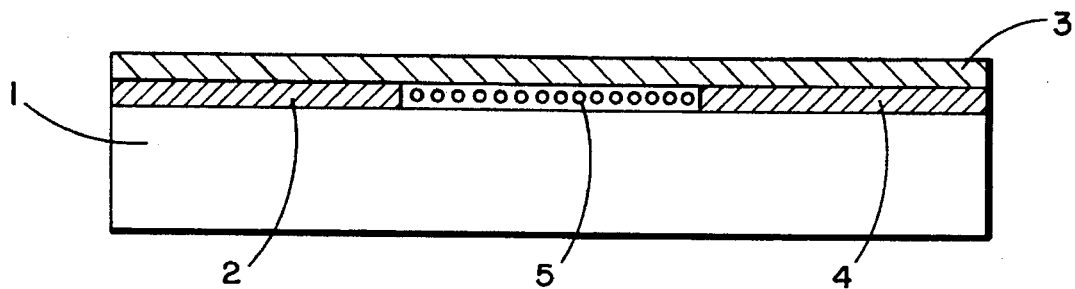
FIG. 1 is a side view of a multi-dielectric laminate.

Reviewing now the Figures wherein like numerals represent like elements throughout the views, FIG. 1 is a side view of applicant's multi-dielectric laminate showing various dielectric materials 2, 4, 5 overlain by common conductor 3 onto common ground plane 1. More specifically, the applicant's multi-dielectric laminate begins with a common ground plane 1 onto which dielectric materials may be mounted. Ground plane 1 is preferably made of aluminum. Onto ground plane 1 is mounted by the thermocompressive bonding a material 5 of low dielectric constant preferably positioned between materials 2 and 4 of high dielectric constants which are used, for example, for mounting power transistors which amplify signals. The high dielectric constant described herein allows circuit miniaturization and better heat dissipation. The heat dissipative quality make this dielectric ideal for power components at microwave frequencies.

Both the high and low dielectric constant material are chosen for their properties at high frequency. However, the loss tangent of the high dielectric constant material is higher than the loss tangent for the low dielectric material. Accordingly, the optimization of signal to noise cannot occur if the signal splitting is on the relatively loss high dielectric constant material. the splitting is therefore performed on the relatively low loss low dielectric constant material. The microwave frequency for this particular assembly is 3 GHz. But their applications are not limited to high frequency or microwave applications and are furthermore not limited to low loss applications.

The high constant materials 2, 4 are comprised of a ceramic filler and preferably titanium dioxide in a PTFE (poly tetrafluoroethelyne) matrix. Although a dielectric constant of 10.2 would be preferred for the high dielectric material, materials having higher or lower dielectric constants can be used. For example, material with a dielectric constant in the neighborhood of 6 would have similar miniaturization capabilities but would not be as effective. The preferred thickness of the high dielectric constant material is net of 0.025 inch. Wavelength of a signal propagating thorough higher dielectric constant material at a constant frequency is shorter than a wavelength in lower dielectric constant materials.

The low dielectric constant material is comprised preferably of woven fiberglass in a PTFE matrix and has a dielectric constant of about 2.2. Dielectric materials other than woven glass supported PTFE such as nonwoven glass supported materials like the Isoclad® dielectric material lines can be used as low dielectric constant. Applicant has found nominal dielectric constants of approximately 2.2 and 10.2, to be suitable for these applications. The low dielectric constant material 5 is used for the splitting of the signal from the single power transition which is performed on high dielectric material 4 onto several parts with low loss, allowing efficient transmission of the signal without much gain of electrical noise in that splitting. The signal continues over conductor 3 to high dielectric material 2 where the signal again travels through a number of power transistors which are equal in number to the number of circuits the signals split into over material 5. The transistors are not part of the dielectric or multidielectric materials but they are soldered on after the print and etch processing. This embodiment is of a specific application where the miniaturized circuit is needed on either end of the signal splitting. The entire board is then mounted in a larger assembly which completes the unit which is an amplifier of radar signal. Other application have included circuit boards in which the low dielectric constant material is on either end of the high dielectric constant miniaturization section.

The process of creating the multi-dielectric laminate involves originally building up the low dielectric constant material separately from several layers of PTFE coated fiber glass and several layers of pure PTFE film with copper foil on both sides. As the dielectric materials 2 and 4 are near net thickness of 0.025 inch, the dielectric material 5 is also built up and laminated to that near thickness of 0.025 inch not including the copper foil to which it is originally laminated and which is etched prior to its subsequent lamination with the high dielectric constant materials. The continuous conductor then has an even surface to which it would laminate.

The low dielectric constant material 5 which is preformed separately from the high dielectric constant materials 2, 4 is laminated separately to a near net thickness for the finished form. The dielectric constant material 5 is then completely etched of copper prior to its lamination into the final assembly. Once it is etched completely of copper foil it is cut to shape and abutted on one side to dielectric 4 and on the other side to dielectric 2. Then the entire assembly is simultaneously laminated.

Figure 2:
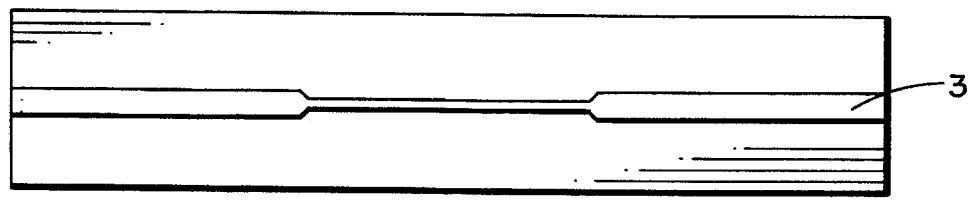
FIG. 2 is a plan view of the multi-dielectric laminate of FIG. 1.

FIG. 2 is simply a plan view of the multi-dielectric laminate of FIG. 1 showing the thin conductive lines bridging the areas having broader conductive stripes.

While the preferred embodiment of the invention has been illustrated in detail, modifications and adaptations of such embodiments will be apparent to those skilled in the art. However, it is to be expressly understood that such modifications and adaptations are within the spirit and scope of the present invention as set forth in the following claims:

I claim:

1. A multi-dielectric laminate, comprising:
   a ground plane;
   a plurality of dielectric materials bonded on said ground plane wherein at least two of said materials possess different dielectric constants; and
   a common conductor bonded over said two dielectric materials.

2. The multi-dielectric laminate of claim 1, wherein the dielectric constant of a first of two dielectric materials is lower than the dielectric constant of the second of two materials.

3. The multi-dielectric laminate of claim 1, wherein the dielectric constant of a first of two dielectric materials is higher that the dielectric constant of the second of two dielectric materials.

4. The multi-dielectric laminate of claim 2, wherein said material of low dielectric constant comprises a woven fiberglass material.

5. The multi-dielectric laminate of claim 2, wherein said material of low dielectric constant comprises non-woven glass.

6. The multi-dielectric laminate of claim 2, wherein said material of low dielectric constant comprises polytetrafluoroethylene.

7. The multi-dielectric laminate of claim 3, wherein said material of high dielectric constant comprises a ceramic filled material.

8. The multidielectric laminate of claim 7, wherein said ceramic filled material is Titanium Dioxide in a polytetraflouroethylene matrix.

9. The multi-dielectric laminate of claim 1, wherein ground plane comprises a metallic substance.

10. The multi-dielectric laminate of claim 9, wherein the metallic substance comprises aluminum.

11. The multi-dielectric laminate of claim 1, wherein the conductor comprises a metallic substance.

12. The multi-dielectric laminate of claim 11, wherein the conductor comprises copper.

13. The multi-dielectric laminate of claim 1, wherein the dielectric materials have a thickness of between 0.0001 inch and 10 inches.

14. The multi-dielectric laminate of claim 1, wherein the thickness of the conductor is between 1000 Angstroms and 0.014 inch.

15. The multi-dielectric laminate of claim 1, wherein the thickness of the ground plane is between 0.001 inch and 3 inches.

16. The multi-dielectric laminate of claim 15, wherein the thickness of the ground plane is between 0.020 inch and 1 inch.

17. The multi-dielectric laminate of claim 16, wherein the thickness of the ground plane is between 0.125 inch and 0.5 inch.

18. The multi-dielectric laminate of claim 17, wherein the thickness of the ground plane is approximately 0.250 inch.

19. The multi-dielectric laminate of claim 2, wherein dielectric constant of the material having a low dielectric constant is between 1 and 10.

20. The multi-dielectric laminate of claim 19, wherein the dielectric constant of the material having a low dielectric constant is approximately 2.2.

21. The multi-dielectric laminate of claim 3, wherein the dielectric constant of the material having a high dielectric constant is between 2.5 and 25.

22. The multi-dielectric laminate of claim 19, wherein the dielectric constant of the material having a high dielectric constant is approximately 10.2.

23. A multi-dielectric laminate as defined in claim 1 wherein said plurality of multidielectric maerials have a boundary therebetween and said common conductor bonded thereover provides constant impedance lines over the boundary between said dielectric materials.

24. A multi-dielectric laminate for propagation of an electrical signal, comprising at least two adjacent side by side component materials overlain with a common conductor on one side, and laminated onto a continuous ground plane on the side opposite the conductor, wherein one of said component materials has a low or high dielectric constant in relation to the adjacent component material.

25. A multi-dielectric laminate as described in claim 24 wherein one of said component materials includes a ceramic filler in a polytetrafluoroethylene matrix.

26. A multi-dielectric laminate as defined in claim 25 wherein one of said component materials is a woven glass supported in polytetrafluoroethylene.

27. A multi-dielectric laminate as defined in claim 25 wherein said ceramic filler is titanium dioxide.

28. A multi-dielectric laminate as defined claim 26 wherein said component including the woven glass supported in polytetrafluoroethylene has a dielectric constant between 2.2 and 10.2.

29. A multi-dielectric laminate as defined in claim 25 wherein said dielectric constant for the ceramic filler component material is up to 10.2.

30. A multi-dielectric laminate as defined in claim 24 wherein said component material having a higher dielectric constant has a dielectric constant from 2.5 to 25.

* * * * *